United States Patent [19]

Jeng

[11] Patent Number: 5,453,157
[45] Date of Patent: Sep. 26, 1995

[54] LOW TEMPERATURE ANISOTROPIC ASHING OF RESIST FOR SEMICONDUCTOR FABRICATION

[75] Inventor: Shin-puu Jeng, Plano, Tex.

[73] Assignee: Texas Instruments Incorporated, Dallas, Tex.

[21] Appl. No.: 242,922

[22] Filed: May 16, 1994

[51] Int. Cl.$^6$ .................................................. H01L 21/00
[52] U.S. Cl. .......................................................... 156/659.11
[58] Field of Search ................................. 156/626, 627, 156/643, 659.1, 661.1, 345

[56] References Cited

U.S. PATENT DOCUMENTS

| | | | |
|---|---|---|---|
| 4,464,460 | 8/1984 | Hiraoka et al. | 156/643 |
| 5,312,717 | 5/1994 | Sachder et al. | 156/643 |

FOREIGN PATENT DOCUMENTS

| | | |
|---|---|---|
| 394739 | 10/1990 | European Pat. Off. . |
| 59-222929 | 12/1984 | Japan . |
| 60-262151 | 12/1985 | Japan . |
| 63-160227 | 7/1988 | Japan . |

OTHER PUBLICATIONS

"Electron Cyclotron Resonance Plasma Etching of Photoresist at Cryogenic Temperatures", J. Appl. Phys., vol. 72, No. 7, pp. 3050–3057; Oct.–1992–Varhue et al.

*Primary Examiner*—R. Bruce Breneman
*Assistant Examiner*—George A. Goudreau
*Attorney, Agent, or Firm*—Kay Houston; James C. Kesterson; Richard L. Donaldson

[57] ABSTRACT

This invention encompasses using anisotropic plasma at a low temperature to strip resist from a semiconductor wafer. A semiconductor wafer 10 is placed in a reactor 26 which contains an oxygen plasma source 28. The oxygen plasma source 28 emits oxygen plasma 32 which is drawn towards the biased wafer 10, exposing the resist layer 22 of the wafer to anisotropic oxygen plasma. A sensor 30 detects when the ashing of the resist is complete, and then the plasma source is turned off.

Advantages of the invention include the ability to remove resist from wafers without damaging polymeric dielectric layers, which are sensitive to the harsh effects of traditional resist removal methods. With the present invention, very little damage occurs to the material on the sidewalls of vias.

4 Claims, 3 Drawing Sheets

LOW TEMPERATURE ANISOTROPIC ASHING OF RESIST FOR SEMICONDUCTOR FABRICATION

FIELD OF THE INVENTION

This invention relates generally to the fabrication of semiconductor devices, and more specifically to resist strip processes.

BACKGROUND OF THE INVENTION

Semiconductors are widely used in integrated circuits for electronic applications, including radios and televisions. Such integrated circuits typically use multiple transistors fabricated in single crystal silicon. Many integrated circuits now contain multiple levels of metallization for interconnections. As geometries shrink and functional density increases, it becomes imperative to reduce the RC time constant within multi-level metallization systems.

Although the dielectric typically used in the past to isolate metal lines from each other was silicon dioxide, recent trends have been towards using materials with low-dielectric constants in order to reduce the RC time constant. Many low-dielectric insulators are either pure polymers (e.g. parylene, BCB, teflon, polyimide) or organic spin-on glass (OSOG, e.g. silsequioxane and siloxane glass). The oxidation resistance of these low-dielectric materials is generally poorer than the oxidation resistance of silicon dioxide.

Conventional ash processes are available for high-aspect-ratio contacts and vias; however, such processes are damaging to dielectric materials, especially low-dielectric materials. Oxygen plasma (ash) is commonly used to remove photoresist from wafer surfaces. The conventional ash process is performed in barrel and down-stream reactors, and is carried out at a high temperature (approximately 250° C.) for a long period of time to assure that all photoresist is completely cleared. Unfortunately, high temperature ash processes not only clear photoresist from the surface of the wafer, but also remove polymer contents from low-dielectric materials, resulting in problems such as shrinking, cracking, moisture absorption, via poisoning, undercutting, and general degradation of the dielectric property of low-dielectric materials. Via integration has presented a problem in the use of low-dielectric materials.

Thus, the use of low-dielectric constant materials in the semiconductor industry has resulted in the need for an ash process that does not damage polymeric dielectric materials while removing the photoresist.

SUMMARY OF THE INVENTION

This invention encompasses using anisotropic plasma at a low temperature to strip resist from a semiconductor wafer. A semiconductor wafer is placed in reactor which contains an oxygen plasma source and an optional sensor. The oxygen plasma source emits oxygen plasma which is drawn towards the wafer by an electric field, exposing the surface of the wafer to anisotropic oxygen plasma. A sensor detects when the ashing of the photoresist of the wafer is complete, and then the plasma source is turned off.

One embodiment is a method for removing resist from a semiconductor wafer, including the steps of coating a substrate with a polymeric dielectric layer, applying an inorganic layer over the polymeric dielectric layer, applying a resist layer over the inorganic layer, patterning the resist layer, etching the inorganic layer, and ashing the resist with an anisotropic oxygen plasma.

Another embodiment is a system for removing resist from a semiconductor wafer, comprising a reactor, a wafer having a polymeric dielectric layer positioned within the reactor, and an oxygen plasma generator located inside the reactor.

An advantage of the invention is the ability to remove resist from wafers with low-dielectric materials, which are sensitive to the harsh effects of traditional resist removal methods. The decomposition of low-dielectric constant materials, which may activate the oxidation reaction, is minimized by lowering the wafer (substrate) temperature. With the present invention, very little damage occurs to the material on the sidewall of the vias.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of several preferred embodiments and alternative embodiments, including manufacturing methods. Corresponding numerals and symbols in the different figures refer to corresponding parts unless otherwise indicated. Table 1 below provides an overview of the elements of the embodiments and the drawings.

TABLE 1

| Drawing Element | Preferred or Specific Examples | Generic Term | Other Alternate Examples or Descriptions |
|---|---|---|---|
| 10 | | Semiconductor wafer | |
| 12 | Silicon | Substrate | May include other metal interconnect layers or other semiconductor elements, (e.g. transistors, diodes); Compound semiconductors (e.g. GaAs, InP, Si/Ge, SiC) may be used in place of Si. |
| 14 | Aluminum alloy | Metal layer | Titanium with an Aluminum bilayer (TiN/Al/TiN); Alloys of Al, Cu, Mo, W, Ti; Polysilicon, silicides, nitrides, carbides; AlCu alloy with Ti or TiN underlayers; Metal interconnect layer. |
| 16 | PETEOS | Oxide layer | $SiO_2$; Silicon nitride. |
| 18 | Organic Spin-on Glass | Polymeric dielectric layer | Other polymers such as parylene, BCB, teflon, polyamide; Organic spin-on glass (OSOG) such as silsequioxane and siloxane glass; Other polymer-containing dielectric materials. |
| 20 | PETEOS | Inorganic layer | Oxide; $SiO_2$; $SiO_2/Si_3N_4$ bilayer. |
| 22 | Polymer | Photoresist layer | Resist layer; other polymers; other light-sensitive materials. |
| 24 | | Via | Ashable layer on a semiconductor wafer |
| 26 | | Reactor | |
| 28 | Oxygen plasma source | Plasma source | |
| 30 | CO detector | Sensor | $CO_2$ detector |
| 32 | Oxygen Plasma | Plasma | |

Figure 1A:
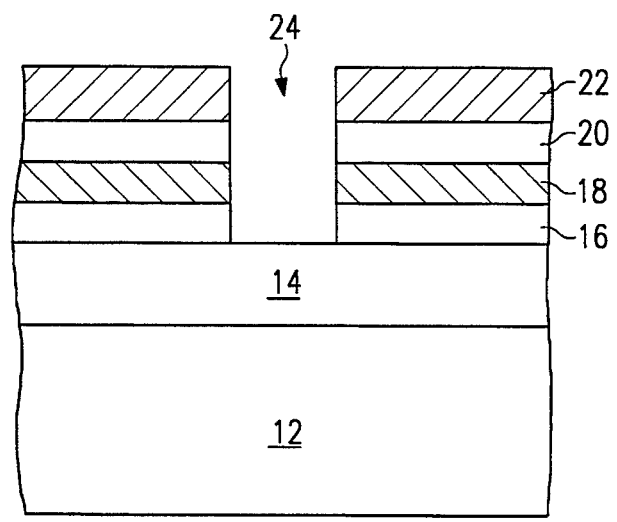
FIG. 1 is a prior art drawing showing the effects of a conventional ash process on a cross-sectional view of a semiconductor via.

FIG. 1 is a prior art drawing of a conventional ash process, which has typically in the past been performed at approximately 250° C. FIG. 1a shows a cross-section of a via 24 of semiconductor wafer 10 before a conventional ash process. The wafer 10 has a substrate 12 which may, for example, contain transistors, diodes, and other semiconductor elements (not shown) as are well known in the art. The substrate 12 may also contain other metal interconnect layers. Metal interconnect layer 14 has been deposited over the substrate 12. Metal interconnect layer 14 may comprise, for example, aluminum or a titanium-tungsten/aluminum bilayer. Oxide layer 16 has been deposited over metal layer 14 and may be made of PETEOS (plasma-enhanced tetraethoxysilane). Polymeric dielectric layer 18 has been deposited over the oxide layer 16 and may comprise, for example, an organic polymer or organic spin-on glass (OSOG). The organic spin-on glass contains a mixture of organic-silicon and oxygen-silicon bondings. Inorganic layer 20 has been deposited over polymeric dielectric layer 18. Inorganic layer 20 is an oxide, preferably $SiO_2$ and in this example, PETEOS. Photoresist layer 22 has been deposited over inorganic layer 20, which may be made of a light-sensitive polymer. Subsequent processing steps have been performed, leaving via 24 in the semiconductor wafer 10. The via 24 has typically been formed through the photoresist layer 22, inorganic layer 20, polymeric dielectric layer 18, and oxide layer 16. The top surface of metal layer 14 usually forms the bottom of the via 24.

Figure 1B:
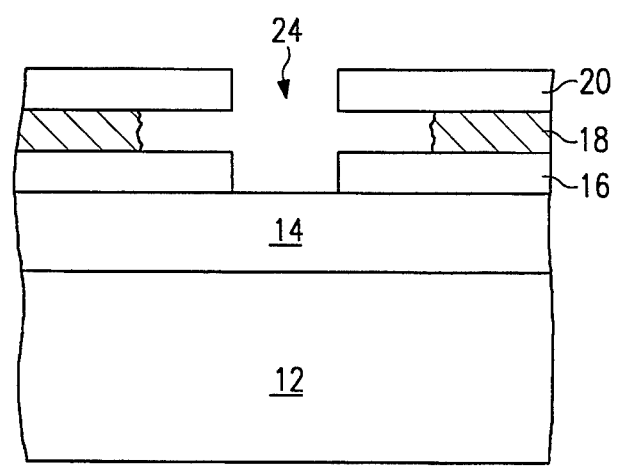

An ash process is performed on wafer 10 to remove the photoresist layer 22. FIG. 1b shows the via profile after the conventional ash process, with damage to the polymeric dielectric layer 18 along the walls of the via 24.

Figure 2:
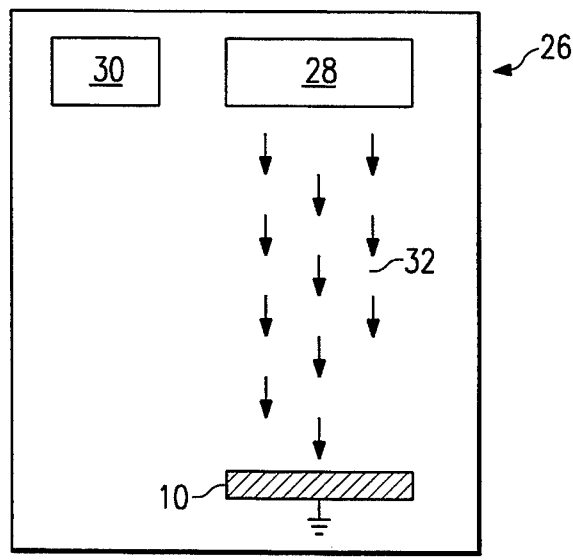
FIG. 2 shows a typical environment in which the present invention may be performed.

A typical environment in which the present invention may be performed is shown in FIG. 2. Semiconductor wafer 10 containing a polymeric dielectric layer is placed in reactor 26 which contains an oxygen plasma source 28 and a sensor 30. The polymeric dielectric layer contains a percentage of polymer by weight sufficient to improve the dielectric constant of $SiO_2$. The polymeric dielectric layer generally contains at least 5% (and preferably between 10% and 50%) of organic polymer by weight. The wafer 10 is biased negatively with regard to the oxygen plasma source 28, for example, by connecting the wafer to ground, to direct positive ions towards the wafer. The ashing process of the present invention is generally performed at low temperature, between approximately −40° C. and 20° C., which is achieved, for example, by the use of liquid nitrogen. The positively-charged oxygen plasma source 28 emits oxygen plasma which is drawn towards wafer 10 by the electric field, exposing the surface of the wafer 10 to anisotropic oxygen plasma 32. The sensor 30 detects when the ashing of the photoresist of the wafer 10 is complete, and then the plasma source 28 is turned off. The sensor 30 may be a CO or $CO_2$ detector; when the intensity of CO or $CO_2$ emission decreases, the system is signalled to shut off. The sensor 30 provides endpoint capability for the ashing system, preventing over-ashing of the wafer.

Figure 3:
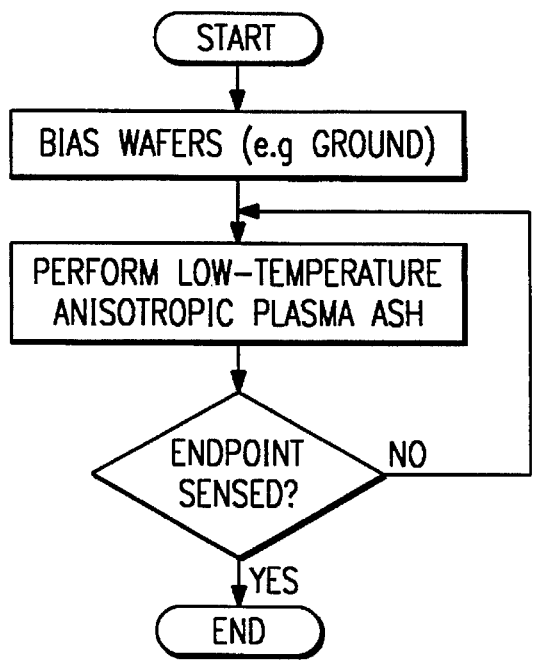
FIG. 3 is a flow chart of the process steps of the invention.

The flow chart for the process is shown in FIG. 3. The wafer is biased to establish a direction for the plasma, and then the low-temperature anisotropic plasma ash is performed. When the endpoint is detected (e.g., when the photoresist has been ashed), then the ashing ceases.

Figure 4A:
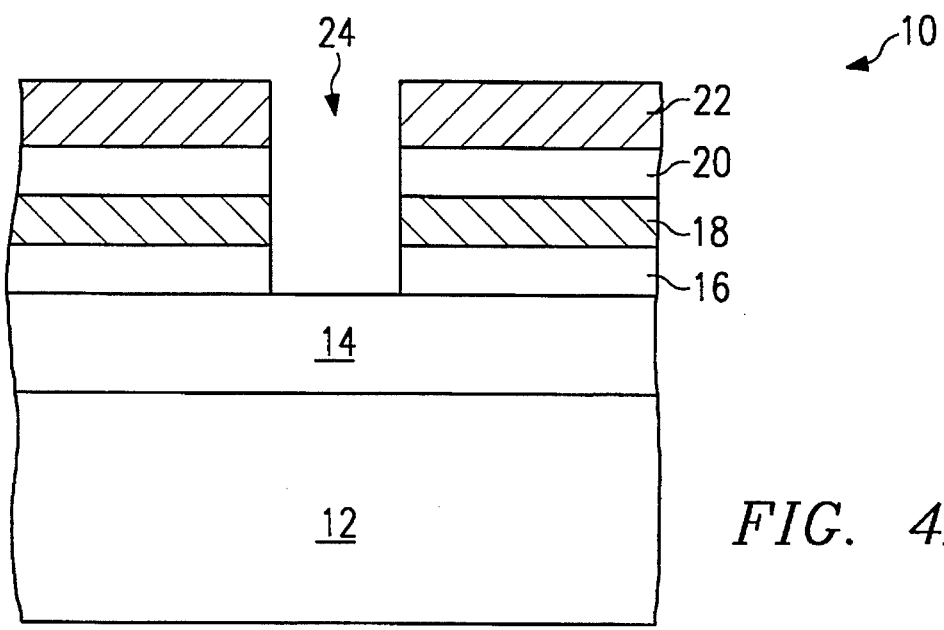
FIG. 4 is a cross-sectional view showing the effects of the present invention on a semiconductor via.
Figure 4B:
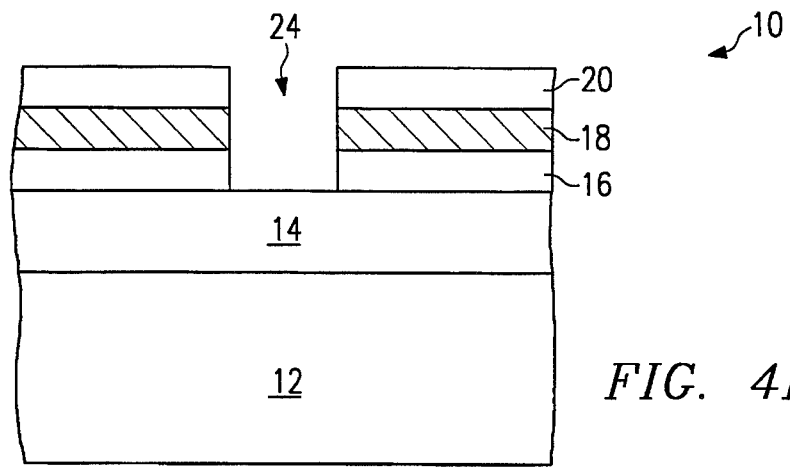

The results of the new ashing process on a typical semiconductor wafer 10 is shown in FIG. 4. FIG. 4a shows a via profile of a semiconductor before the new ash process, the same as described for FIG. 1a. FIG. 4b shows the via 24 after the ashing method of the present invention has been performed, with no damage to the polymeric dielectric layer 18.

Figure 5A:
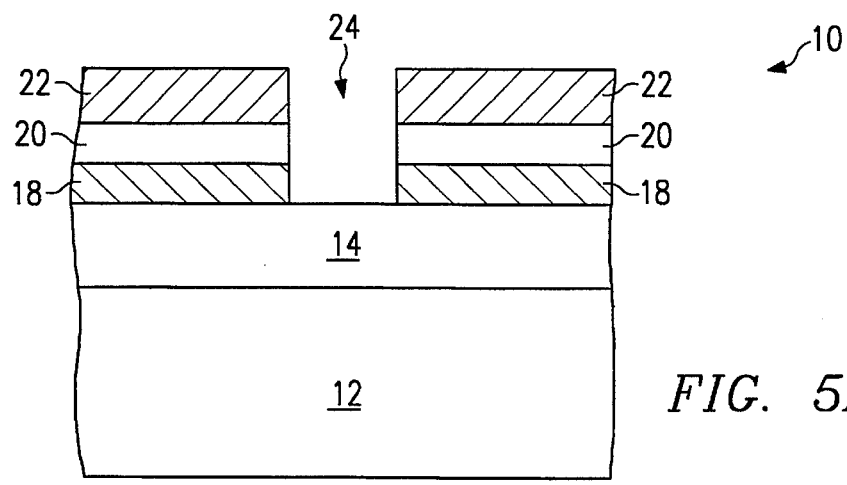
FIG. 5 is a cross-sectional view of an example of an alternate semiconductor circuit.
Figure 5B:
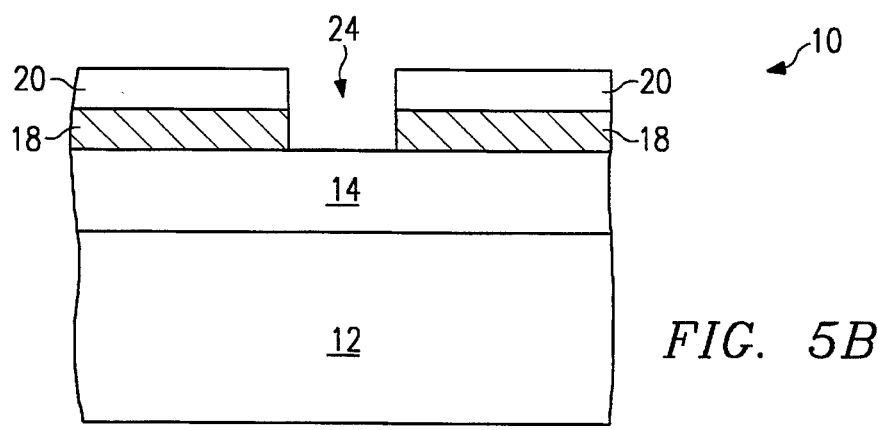

The structure shown in FIGS. 1 and 4 may vary. FIG. 5 shows an example of another semiconductor wafer 10 that could be ashed with the present invention. Other semiconductor structures could benefit from the low-temperature resist strip process.

After the ashing of the photoresist is complete, further processing steps are performed as required. For example, the via is typically filled with metal to form an interconnect between layers.

Performing an ash at the low temperatures (−20° to 20) as required of this invention may result in increased time required to perform the ash, compared to conventional ashing techniques. The flux, or ion current, may be varied to alleviate this increase in time required. For example, if the flux is increased, less time will be required to perform the ash process.

The novel method of using a low-temperature anisotropic ash with endpoints to strip resist can offer definite advantages over the conventional processes. First, the anisotropic ions can bombard the planar surface containing the resist to be ashed, and simultaneously clean any residue off the surface of the metal. Because the ash is anisotropic, very little damage will occur to the polymeric dielectric material on the sidewall. The directionality of the moving oxygen species ($O^+$) limits the reactivity of the sidewall with the oxygen.

Second, the endpoint capability can stop the ashing process before any damage occurs in undesirable locations, in this case to the polymeric dielectric layer sidewall of the via. The use of a sensor to attain the endpoint capability is optional and gives the benefit of more control to the ash process.

Third, the low temperature can reduce the reactivity between the polymer and the sidewall of the dielectric layer with the oxygen plasma. The low temperature slows the activity of the molecules, allowing a more controlled ash process.

This invention is beneficial to other materials, particularly material sensitive to conventional ash processes. The invention is particularly useful for the ashing of semiconductor wafers using polymeric dielectric materials, because the damage caused to the polymeric dielectric materials by traditional methods of removing resist is undesirable and extensive, causing many problems in semiconductor manufacturing. The present invention, a low temperature resist strip process, eliminates or minimizes such damage to the polymeric dielectric material. In addition, the ash process of the present invention may remove native oxide on the metal layer.

While the invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for removing resist from a semiconductor wafer having a substrate, including the steps of:

depositing a metal layer over said substrate;

coating said substrate with a polymeric layer;

applying an inorganic layer over said polymeric layer;

applying a resist layer over said inorganic layer;

patterning said resist layer;

etching said inorganic layer; and ashing said resist with an anisotropic oxygen plasma.

2. A system for removing resist from a semiconductor wafer, comprising:

a reactor;

a wafer having a polymeric layer positioned within said reactor;

an oxygen plasma source located inside said reactor;

a wafer biasing apparatus to anisotropically direct ions from a plasma toward said wafer; and a sensor located inside said reactor to detect when resist has been removed.

3. The system of claim 2 wherein said system is shut off when said sensor detects completion of resist removal.

4. A system for removing resist from a semiconductor wafer, comprising:

a reactor;

a wafer having a polymeric layer positioned Within said reactor;

an oxygen plasma source located inside said reactor; and a wafer biasing apparatus to anisotropically direct ions from a plasma toward said wafer, wherein said wafer is biased to ground.

* * * * *